United States Patent [19]

Wilczak et al.

[11] Patent Number: 4,845,011
[45] Date of Patent: Jul. 4, 1989

[54] VISIBLE LIGHT PHOTOINITIATION COMPOSITIONS

[75] Inventors: Wojciech A. Wilczak, Scotch Plains; Margaret W. Geiger, Neshanic Station, both of N.J.

[73] Assignee: Hoechst Celanese Corporation, Somerville, N.J.

[21] Appl. No.: 112,795

[22] Filed: Oct. 23, 1987

[51] Int. Cl.$^4$ .......................... G03C 1/63; G03C 5/00
[52] U.S. Cl. ........................ 430/281; 522/26; 430/270; 430/915; 430/920; 430/272; 430/343
[58] Field of Search ................. 430/281, 920; 522/26, 522/28

[56] References Cited

U.S. PATENT DOCUMENTS

| | | |
|---|---|---|
| 3,729,313 | 4/1973 | Smith . |
| 3,954,475 | 5/1976 | Bonham et al. . |
| 3,961,961 | 5/1976 | Rich ..................................... 430/281 |
| 4,011,568 | 3/1977 | Oughton et al. ......................... 354/3 |
| 4,239,850 | 12/1980 | Kita et al. . |
| 4,258,123 | 3/1981 | Nagashima et al. . |
| 4,481,276 | 11/1984 | Ishikawa et al. . |
| 4,505,793 | 3/1985 | Tamoto et al. . |
| 4,584,260 | 4/1986 | Iwasaki et al. ...................... 430/288 |
| 4,735,632 | 4/1988 | Oxman et al. ........................ 430/332 |

FOREIGN PATENT DOCUMENTS

| | | |
|---|---|---|
| 1142788 | 3/1983 | Canada . |
| 0053747 | 9/1980 | Japan . |
| 60-060104 | 4/1985 | Japan . |

OTHER PUBLICATIONS

Chemical Abstracts, vol. 101, 238170j, 1984.

Primary Examiner—Paul R. Michl
Assistant Examiner—Christopher D. Rodee
Attorney, Agent, or Firm—Plottel & Roberts

[57] ABSTRACT

A photo polymerization initiator composition is disclosed. The composition is comprised of an in admixture with an acridine, initiator compound. The initiator composition is useful is preparing photopolymerizable compositions having increased effective photospeed.

25 Claims, No Drawings

VISIBLE LIGHT PHOTOINITIATION COMPOSITIONS

BACKGROUND OF THE INVENTION

The present invention relates to photoinitiators which have visible light sensitivity and are useful for laser imaging systems. In general such imaging systems have much lower light intensity than conventional lithographic exposure apparatus. More particularly, the invention relates to a photopolymerizable composition having increased effective photosensitivity which find use in producing photosensitive elements such as lithographic printing plates of the projection speed variety.

The prior art teaches a variety of photopolymerizable compositions. These generally comprise an ethylenically unsaturated monomer or oligomer preferably having two or more double bonds, a photoinitiator capable of causing the free radical polymerization of the unsaturated component upon exposure to actinic radiation, and usually binder resins, colorants and components to prevent premature polymerization. Further, these compositions are widely used in photopolymer type photoresists, color proofing films and printing plates.

Useful photo polymerization initiators include various substances which have been found to be practical. For example, there are benzoin compounds such as benzoin, benzoin methyl ether, or benzoin ethyl ether, etc., carbonyl compounds such as benzil, benzophenone, acetophenone or Michler's ketone, etc., azo compounds such as azobisisobutyronitrile, as well as initiators of the acridine, quinoxaline or phenazine classes. While such photoinitiators are certainly useful within their concepts, it is often desired to produce photographic elements which are sensitive in the visible portion of the spectrum which have a greater effective photospeed than these known initiators. Higher effective photospeed is desired for photosensitive elements which are exposed by low intensity lasers or projection speed plates. In non-projection speed plates, exposure is conducted by placing an exposure mask in direct contact with the photographic emulsion in a vacuum frame. Exposure is then conducted with a high intensity ultraviolet light source. In a projection exposure system, the exposure mask is placed in the path of an exposure unit between the light source and a camera's objective lens. The image projects through the lens down onto a printing plate positioned on a platform. Exposure energy and duration is greatly reduced, therefore, photosensitivity should be commensurately enhanced. The foregoing classes of photo-initiators alone are not satisfactorily sensitive for such use. Lasers used for exposure are also of the low intensity variety. The invention provides a synergistic admixture of compounds which is capable of initiating polymerization upon exposure to light in the 400–500 nm range. It is useful for exposure with a 488 nm argon laser.

SUMMARY OF THE INVENTION

The invention provides a photopolymerization initiator composition which comprises a basified acridine compound, and at least one mono-, di-, or tri halomethyl substituted triazine or quinazolinone initiator. The composition also optionally contains Michler's ketone for an additional increase in sensitivity.

The invention also provides a photopolymerizable composition which comprises a photopolymerizable compound containing at least two ethylenically unsaturated double bonds and the above initiator composition.

The invention also provides a photographic element which comprises a substrate and a photopolymerizable composition coated on said substrate, which photopolymerizable compound containing at least two ethylenically unsaturated double bonds and the above photopolymerization initiator composition.

DETAILED DESCRIPTION OF THE PREFERRED EMBODIMENT

In general, the photoinitiator composition of this invention comprises at least one basified acridine compound and at least one of the foregoing types of triazines or quinazolinone compounds.

Acridine dye compounds are per se known in the art, and are more fully described, for example, in U.S. Pat. No. 3,751,259 which is incorporated herein by reference.

In order to be useful for the compositions of this invention, these acridine compounds, which are either acidic or in the salt form must be basified. This is done, for example by reaction of the acridine and a base, such as sodium hydroxide in water. The precipitate is then washed and dried prior to use in this invention. The most preferred acridine compounds used a starting materials are acridine orange and acridine yellow which respectively have the formulas:

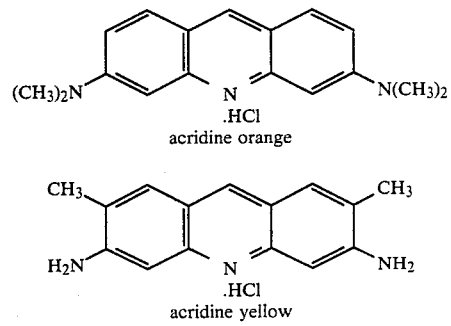

The general structure for the basified acridines may be represented as:

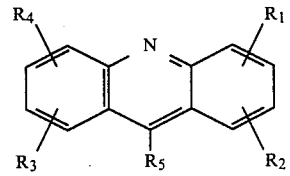

wherein:
$R_1$ = —$NH_2$ or $N(CH_3)_2$, or —$N(CH_2CH_3)_2$ or —$N(CH_2CH_2CH_3)_2$, or —H
$R_2$ = —H, or —$CH_3$, or —$CH_2CH_3$, or —$CH_2CH_2CH_3$, or halogen
$R_3$ = —H, or —$CH_3$, or —$CH_2CH_3$, or —$CH_2CH_2CH_3$, or halogen
$R_4$ = —$NH_2$, or —$N(CH_3)_2$, or —$N(CH_2CH_3)_2$ or —$N(CH_2CH_2CH_3)_2$, or —H
$R_5$ = —H, or —$CH_3$, or phenyl, or phenyl substituted with: —$NH_2$, or —$N(CH_3)_2$, or —$N(CH_2CH_3)_2$, or —$N(CH_2CH_2CH_3)_2$, or COOH, at any position.

The second component of the initiator composition is a mono-, di-, or tri-halomethyl substituted triazine or quinazolinone compound. Non-exclusive examples of such triazine compounds are 2-methyl-4,6-bis(trichloromethyl)-1,3,5,-triazine, 2,4,6-tris(trichloromethyl)-1,3,5-triazine, 2-methyl-4,6-bis(tribromomethyl-1,3,5-triazine, 2,4,6-tris(tribromomethyl)-1,3,5-triazine, 2,4,5-tris(dichloromethyl)-1,3,5-triazine, 2,4,6-tris(dibromomethyl)-1,3,5-triazine, 2,4,6-tris(bromomethyl)1,3,5-triazine, 2,4,6-tris(chloromethyl)-1,3,5-triazine, 2-phenyl-4,6-bis(trichloromethyl)-1,3,5-triazine, 2-p-methoxyphenyl)-4,6-bis(tribromomethyl)-1,3,5-triazine, 2-phenyl-4,6-bis(tribromomethyl)-1,3,5-triazine, 2-(p-chlorophenyl)-4,6-bis(trichloromethyl)-1,3,5-triazine, 2-(p-tolyl)-4,6-bis(trichloromethyl)-1,3,5-triazine.

Other such compounds are enumerated in U.S. Pat. Nos. 3,729,313; 4,239,850; 4,481,276; and 4,505,793 which are incorporated herein by reference.

The quinazolinone compounds useful for this invention include 2-trichloromethyl-4(3H)-quinazolinone as well as 2-tribromomethyl-4(3H)-quinazolinone. Such are more fully described in German Pat. DE No. 3 339 228 which is incorporated herein by reference.

The ratio of the acridine compound to triazine or quinazolinone compound may range from about 1:20 to about 4:1 or more preferably from about 1:15 to 3:1 and most preferably from about 1:10 to 2:1. Michler's ketone may optionally be included in an amount of about 5% to about 40%, preferably about 10% to about 20% based on the weight of the initiator composition.

The photopolymerizable composition of this invention generally comprises a photopolymerizable material having at least two double bonds and the foregoing photoinitiator composition. The photopolymerizable composition additionally has a binder resin in the preferred embodiment.

The photopolymerizable material comprises an addition polymerizable, nongaseous (boiling temperature above 100° C. at normal atmospheric pressure), ethylenically-unsaturated compounds containing at least two terminal ethylenic groups, and being capable of forming a high molecular weight polymer by free-radical initiated, chain propagating addition polymerization. Suitable polymerizable materials non-exclusively include such acrylic or methacrylic acid esters as polybutane diol diacrylate, tetraethylene glycol dimethacrylate, ethylene glycol dimethacrylate, trimethylol propane timethyacrylate, trimethylol propane triacrylate, polyethylene glycol (200) diacrylate, diethylene glycol dimethacrylate, pentaerythritol tetraacrylate, dicyclopentenyl acrylate, dicyclopentenyl methacrylate, 1,4 butane diol diacrylate, 1,6,hexanediol dimethacrylate, dipentaerythritol monohydroxypentaacrylate, ethoxylate bisphenol A dimethacrylate and tripropylyene glycol diacrylate.

Binders found suitable for this use are styrene/maleic anhydride polymers that can vary in monomer content at a ratio of from about 70/30 to about 95/5; polymethyl methacrylate/methacrylic acid copolymers having a ratio of monomers ranging from about 70/30 to 95/5; polymethyl methacrylate/ethyl acrylate/methacrylic acid copolymer having a ratio of monomers ranging from about 50/30/20 to about 90/5/5; polymethyl methacrylate/butyl acrylate/methacrylic acid copolymer having a ratio of monomers ranging from about 50/30/20 to about 90/5/5. Binders with no acid value but with the solubility characteristics to develop properly in the alkaline aqueous developers useful for the invention. Examples of this type of binder system non-exclusively include polyvinyl pyrrolidone polymers K-60 and K-90 (G.A.F.) cellulosic resins such as hydroxypropyl cellulose, methyl cellulose and ethyl hydroxy ethyl cellulose polymers. Additional binders non-exclusively include polyvinyl acetals such as polyvinyl formal and polyvinyl butyral available as Formvar and Butvar from Monsanto, and polyvinyl alcohols. Also useful are such oligomers as Uvithane 788 (Morton Thiokol) and Macromer 13KRC (Sartomer).

One preferred binding resin has the general formula

wherein a plurality of each of components A, B and C occur in ordered or random sequence in the resin and wherein A is present in said resin at about 5% to about 20% by weight and comprises groups of the formula

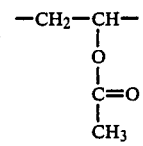

B is present in said resin at about 4% to about 30% by weight and comprises groups of the formula

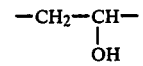

and C is present in said resin at about 50% to about 91% by weight and comprises acetal groups consisting of groups of the formulae

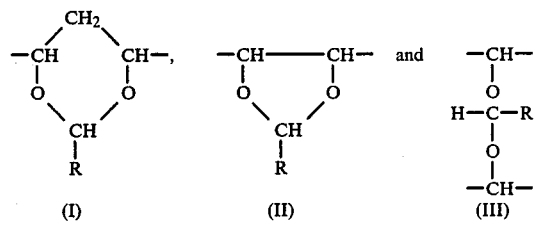

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C. This composition is more fully described in U.S. Pat. No. 4,670,507 which is incorporated herein by reference.

Pigments or dyes may typically be included in the photopolymerizable composition to provide color to the image areas. Preferred colorants for this invention are pigments and dyes. They are dispersed in a small amount of a suitable vehicle such as polymethyl methacrylate/methacrylic acid (85/15) and methyl ethyl ketone solvent.

Additional non-exclusive exmples of colorants usable in the present invention are as follows: Benzidine Yellow G (C.I. 21090), Benzidine Yellow Gr (C.I. 21100), Permanent Yellow DHG (product of Hoechst AG), Brilliant Carmine 6B (C.I. 15850), Rhodamine 6G Lake (C.I. 45160), Rhodamine B Lake (C.I. 45170), Phthalocyanine Blue non-crystal (C.I. 74160), phthalocyanine Green (C.I. 74260), Carbon Black, Fat Yellow 5G, Fat Yellow 3G, Fat Red G, Fat Red HRR, Fat Red 5B, Fat Black HB, Zapon Fast Black RE, Zapon Fast Black G, Zapon Fast Blue HFL, Zapon Fast Red BB, Zapon Fast Red GE, Zapon Fast Yellow G, quinacridone Red (C.I. 46500).

In the practice of the present invention the binder component is preferably present in the composition in an amount sufficient to bind the composition components in a uniform mixture and a uniform film when it is coated on a substrate. It is preferably present in an amount ranging from about 18% to about 40% based on the weight of the solids in the layer. A more preferred range is from about 20% to about 38% and most preferably from about 22% to about 33%.

In the practice of the present invention the photoinitiator composition is preferably present in the photopolymerizable composition in an amount sufficient to initiate the free radical polymerization of the unsaturated component upon exposure to imaging energy. It is preferably present in an amount ranging from about 5% to about 25% based on the weight of the solids in the layer. A more preferred range is from about 8% to about 22% and most preferably from about 10% to about 20%.

In the practice of the present invention the colorant component is preferably present in an amount sufficient to uniformly color the photopolymerizable composition. It is preferably present in an amount ranging from about 1% to about 20% based on the weight of the solids in the layer. A more preferred range is from about 3% to about 18% and most preferably from about 5% to about 15%.

In the practice of the present invention the unsaturated component is preferably present in the composition in an amount sufficient to cause an imagewise latent differential in the polymerizable composition when it is coated on a substrate and imagewise exposed to imaging energy. It is preferably present in an amount ranging from about 20% to about 60% based on the weight of the solids in the layer. A more preferred range is from about 22% to about 58% and most preferably from about 25% to about 55%. Other components which may be included in the radiation-polymerizable composition of this invention include acid stabilizers, exposure indicators, plasticizers and photoactivators.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid and mixtures thereof. Preferably, the acid stabilizer is phosphoric acid. When used, the acid stabilizer is preferably present in the radiation-polymerizable composition in the amount of from about 0.3% to about 2.0%, and most preferably from about 7.5% to about 1.5%, although the skilled artisan may use more or less as desired.

Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired. The photoactivator which may be included in the composition of this invention should be an amine-containing photoactivator which combines synergistically with the free-radical photoinitiator in order to extend the effective halflife of the photoinitiator, which is normally in the approximate range of about $10^{-9}$ to $10^{-15}$ seconds. Suitable photoactivators include 2-(N-butoxy)ethyl-4-dimethylamino benzoate, 2-(dimethylamino)amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably dioctylphthalate. The plasticizer is preferably present in the composition of this invention in an amount of from about 0.5% to about 1.25% be weight, although the skilled artisan may use more or less as desired.

In order to form a coating composition for the production of photographic elements, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol, and ketones such as methyl ethyl ketone, or mixtures thereof. Preferably, the solvent comprises a mixture of tetrahydrofuran, propylene glycol, monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a photographic element such as a color proofing film, silk screen stencil, photoresist or lithographic printing plate include sheets of transparent films such as polyester, aluminum and its alloys and other metals, fabrics, silicon and similar materials useful for semiconductors such as gallium arsenide which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the base composition of the present invention, preferably at a coating weight of from about 0.6 g/m$^2$ to about 30.0 g/m$^2$, more preferably from about 0.8 g/m² to about 2.0 g/m² and most preferably from about 1.2 g/m° to about 1.5 g/m², although these coating weights are not critical to the practice of this invention, and dried.

The light sensitive layer is then exposed to actinic radiation such as ultraviolet or x-ray or exposed to a particle beam such as electron or ion beam. In the preferred embodiment, the photosensitive layer is imagewise exposed by means well known in the art. Such exposure may be conducted by exposure to a UV light source through a photomask under vacuum frame conditions. Exposure may be performed with actinic light through a conventional negative flat.

Exposures are preferred with emulsion-to-emulsion contact. Mercury vapor discharge lamps are preferred to metal halide lamps. Filters may be used to reduce light scattering in the material. The materials of this invention are most well suited for projection exposure by a technique well known to the skilled artisan.

Preferably the thusly prepared photographic element is exposed to actinic radiation through a negative test flat so as to yield a solid 6 on a 21 step Stouffer exposure wedge after development. The exposed plate is then developed with a suitable aqueous developer composition such as a developer which comprises an aqueous solution containing one or more of the following groups:

(a) a sodium, potassium or lithium salt of octyl, decyl or dodecyl monosulfate;

(b) a sodium, lithium, potassium or ammonium metasilicate salt; and (c) a lithium, potassium, sodium or ammonium borate salt; and (d) an aliphatic dicarboxylic acid, or sodium, potassium or ammonium salt thereof having from 2 to 6 carbon atoms; and (e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807. The developer may also contain organic solvents which are well known in the art, although these are less preferred.

The following examples are illustrative of the invention but it is understood that the invention is not limited thereto.

EXAMPLE 1

Slurry grained, anodized aluminum is coated with a #24 wire wound rod with the following solutions (amounts given in weight percent).

| | A | B |
|---|---|---|
| propylene glycol methyl ether | 56.00 | 56.00 |
| methyl ethyl ketone | 23.76 | 23.76 |
| gamma-butyrolactone | 12.96 | 12.96 |
| scripset 540 (styrene/maleic anhydride from monsanto) | 1.72 | 1.72 |
| resin[1] | .26 | .26 |
| pentaerythritol triacrylate | 3.83 | 3.83 |
| Michler's ketone | .19 | .19 |
| acridine orange base | .19 | |
| acridine yellow base | | .19 |
| 2-trichloromethyl-4(3H)—quinaolinone | 1.09 | 1.09 |

[1]Resin - partially hydrolyzed poly (vinyl acetate), partially modified with propanol, as described in U. S. Pat. No. 4,652,604.

[1]Resin—partially hydrolyzed poly(vinyl acetate), partially modified with propanol, as described in U.S. Pat. No. 4,652,604.

The coated plates are oven dried (66° C.), then overcoated with 3% poly(vinyl alcohol) (Gelvatol 20/30) with a #24 wire wound rod.

The plates are exposed with a 2000 W photopolymer lamp on low intensity setting using a Stouffer scale both with no filter and through Dylux (from Du Pont) clearing film, which cuts off wavelengths of light below 400 nm (table 1). Plates are developed with ENCO NAPS®/PAPS® developer (available from Hoechst Celanese Corporation).

TABLE 1

Stouffer solid (S) and ghost (G) results for plates coated with solutions A and B.

| | no filter | | | with Dylux clearing film | | |
|---|---|---|---|---|---|---|
| | exposure time (s) | S | G | exposure time (s) | S | G |
| A | 5 | | 8 | 40 | | 6 |
| B | 5 | 10 | 11 | 40 | 7 | 8 |

The same plates are exposed with 100 W Xe lamp filtered with a Schott GG-455 filter or with a GG-475 filter, which cut off wavelengths of light below 455 nm and 475 nm respectively (table 2).

TABLE 2

Stouffer results for exposures with 100 W Xe lamp.

| | GG-455 | | GG-475 | |
|---|---|---|---|---|
| | exposure time (sec) | G | exposure time (sec) | G |
| A | 20 | 9 | 10 | 6 |
| B | 10 | 7 | 10 | 5 |

EXAMPLE 2

Slurry grained, anodized aluminum is coated as described in example 1 with the following solutions.

| | A | B |
|---|---|---|
| propylene glycol, monomethyl ether | 56.000 | 56.073 |
| methyl ethyl ketone | 23.747 | 23.780 |
| gamma-butyrolactone | 13.072 | 13.090 |
| scriplet 540 | 1.743 | 1.745 |
| resin[1] | .261 | .261 |
| ethoxylated trimethololpropane triacrylate | 3.813 | 3.818 |
| Michler's ketone | .142 | |
| acridine yellow base | .142 | .142 |
| tris(trichloromethyl)-triazine | 1.089 | 1.091 |

[1]Resin - partially hydrolyzed polyvinylacetate, partially modified with propanol, as described in U. S. Pat. No. 4,652,604.

[1]Resin—partially hydrolyzed polyvinylacetate, partially modified with propanol, as described in U.S. Pat. No. 4,652,604.

The plates are overcoated with poly (vinyl alcohol) as described in example 1. Exposure with a 2000 W photopolymer lamp on low intensity with and without Dylux clearing film as a filter is followed by development with ENCO NAPS®/PAPS® developer. The plates are finished with ENCO PMF finisher (available from Hoechst Celanese Corporation) and inked (table).

TABLE

Inked solid Stouffer (S) of compositions with and without Michler's ketone.

| | no filter | | with Dylux clearing film | |
|---|---|---|---|---|
| | exposure time (sec) | S | exposure time (s) | S |
| A | 2 | 7 | 15 | 4 |

TABLE-continued

| Inked solid Stouffer (S) of compositions with and without Michler's ketone. | | | |
|---|---|---|---|
| no filter | | with Dylux clearing film | |
| exposure time (sec) | S | exposure time (s) | S |
| B | 2 | 4 | 15 | 10 |

EXAMPLE 3

Adhesion-promoted polyester base is wire-rod (#12) coated with the following photosensitive solution (weight percent).

methyl cellosolve: 49.514
methyl ethyl ketone: 21.011
gamma-butyrolactone: 11.449
scripset 540: 1.541
resin 1: 0.385
Michler's ketone: 0.164
acridine yellow base: 0.048
pentaerythritol triacrylate: 3.370
tris(trichloromethyl)triazine: 0.963
resin 1 blue pigment dispersion: 11.555 resin 1 described in example 1.

Coated film is oven dried (66° C.), and overcoated with a solution of 3% poly-(vinyl alcohol) (Gelvatol 20/30) with a #24 wire-rod. Exposure for 5 seconds through 475 nm cutoff filter with a 100 W xenon lamp at a distance of 6 inches and developent with ENCO NAPS ®/PAPS ® developer results in a clear 6 on the Stouffer scale.

EXAMPLE 4

As a comparative example the following composition is formed.

| | Grams |
|---|---|
| methyl cellosolve | 51.42 |
| methyl ethyl ketone | 21.82 |
| scripset 540 | 1.57 |
| resin 1 from example 1 | 0.25 |
| trichloromethyl quinazolinone | 1.0 |
| acridine orange hydrochloride | 0.17 |
| pentacrythitol triacrylate | 3.5 |
| resin 1 cyan dispersion | 12.0 |

The composition is coated on a sheet of polyester film, dried, and overcoated with Gelvatol polyvinyl alcohol. It is exposed through a GG455 Schott filter for 1 minute with a xenon 100 W lamp. After development with ENCO NAPS ®/PAPS ® developer no image is noted. This example demonstrates that no image is formed using the salt (i.e. nonbasified) form of the acridine compound.

EXAMPLE 5

Example 4 is repeated except the basified form of the acridine orange compound is used. The basified form is obtained by treatment of acridine orange hydrochloride salt with an excess of 10% KOH in water. The precipitate is washed with water and dried. Upon use and exposure of this compound in the example 4 formulation a clear step 7 on the Stouffer scale is obtained.

What is claimed is:

1. A photopolymerization initiator composition which comprises in admixture, a basified acridine compound and a mono-, di-, or tri- halomethyl substituted triazine or quinazolinone compound wherein the weight ratio of acridine compound to triazine or quinazolinone compound ranges from about 1:20 to about 4:1.

2. The initiator composition of claim 1 which further comprises Michler's ketone in admixture in an amount of from about 5 to about 40 parts by weight of the initiator composition.

3. The initiator composition of claim 1 which comprises one or more compounds selected from the group consisting of a trichloromethyl triazine and a trichloromethyl quinazolinone.

4. The initiator composition of claim 1 wherein the weight ratio of basified acridine compound to triazine or quinazolinone compound ranges from about 1:15 to about 3:1.

5. A photopolymerizable composition which comprises in admixture a photopolymerizable compound containing at least two ethylenically unsaturated double bonds and a photopolymerization initiator composition which initiator composition comprises in admixture, a basified acridine compound and a mono-, di-, or tri-halomethyl substituted triazine or quinazolinone compound, which initiator is present in sufficient amount to photopolymerize the photopolymerizable compound wherein the ratio of acridine to triazine or quinazolinone compound ranges from about 1:20 to about 4:1 based on the weight of the initiator composition.

6. The photopolymerizable composition of claim 5 wherein the photopolymerizable compound is an acrylic or methacrylic acid ester.

7. The photopolymerizable composition of claim 5 further comprising a binder in sufficient amount to bind the composition components in a uniform mixture.

8. The photopolymerizable composition of claim 5 comprising a binder selected from the group consisting of polyvinyl acetals, polyvinyl pyrrolidone, cellulosic resins, styrene maleic anhydride copolymers, styrene/-maleic anhydride polymers having a monomer ratio of from about 70/30 to about 95/5; polymethyl methacrylate/methacrylic acid copolymers having a monomer ratio of from about 70/30 to about 95/5; polymethyl methacrylate/ethyl acrylate/methacrylic acid copolymer having a monomer ratio of from about 50/30/20 to 90/5/5; and polymethyl methacrylate/butyl acrylate/methacrylic acid copolymer having a monomer ratio of from about 50/30/20 to about 90/5/5.

9. The photopolymerizable composition of claim 7 wherein the binding resin has the general formula

—A—B—C— wherein a plurality of each of components A, B and C occur in ordered or random sequence in the resin and wherein A is present in said resin at about 5% to about 20% by weight and comprises groups of the formula

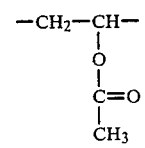

B is present in said resin at about 4% to about 30% by weight and comprises groups of the formula

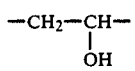

and C is present in said resin at about 50% to about 91% by weight and comprises acetal groups consisting of groups of the formulae

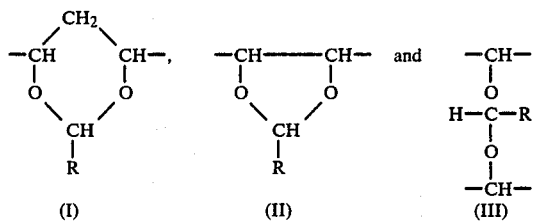

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C.

10. The photopolymerizable composition of claim 5 which further comprises Michler's ketone in an amount of from about 5 to about 40 parts by weight of the initiator composition.

11. The photopolymerizable composition of claim 5 which comprises one or more compounds selected from the group consisting of a trichloromethyl triazine and a trichloromethyl quinazolinone.

12. The photopolymerizable composition of claim 5 wherein the weight ratio of acridine compound to triazine or quinazolinone compound ranges from about 1:15 to about 3:1.

13. The photopolymerizable composition of claim 5 further comprising one or more components selected from the group consisting of colorants, acid stabilizers, exposure indicators, plasticizers, solvents and photoactivators.

14. A photographic element which comprises a substrate and a photopolymerizable composition coated on said substrate, which photopolymerizable composition comprises in admixture a photopolymerizable compound containing at least two ethlenically unsaturated double bonds and a photopolymerization initiator composition which initiator composition comprises in admixture, a basified acridine compound and a mono-, di- or tri- halomethyl substituted triazine or quinazolinone compound, which initiator is present in sufficient amount of photopolymerize the photopolymerizable compound wherein the ratio of acridine to triazine or quinazolinone compound ranges from about 1:20 to about 4:1 based on the weight of the initiator composition.

15. The photographic element of claim 14 wherein said substrate comprises a material selected from the group consisting of transparent films, metals, fabrics and semiconductor materials.

16. The photographic element of claim 14 wherein said substrate comprises a material selected from the group consisting of polyester, silicon, gallium arsenide, aluminum and its alloys.

17. The photographic element of claim 14 wherein said substrate comprises aluminum or an aluminum alloy sheet, the surface of which has been subjected to one or more treatments selected from the group consisting of graining, anodizing and hydrophilizing.

18. The photographic element of claim 14 wherein the photopolymerizable compound is an acrylic or methacrylic acid ester.

19. The photographic element of claim 14 wherein the photopolymerizable composition further comprising a binder in sufficient amount to bind the composition components in a uniform mixture.

20. The photographic element of claim 19 comprising a binder selected from the group consisting of polyvinyl acetals, polyvinyl pyrrolidone, cellulosic resins, styrene maleic anhydride copolymers, styrene/maleic anhydride polymers having a monomer ratio of from about 70/30 to about 95/5; polymethyl methacrylate/methacrylic acid copolymers having a monomer ratio of from about 70/30 to about 95/5; polymethyl methacrylate/ethyl acrylate/methacrylic acid copolymer having a monomer ratio of from about 50/30/20 to about 90/5/5; and polymethyl methacrylate/butyl acrylate/methacrylic acid copolymer having a monomer ratio of from about 50/30/20 to about 90/5/5.

21. The photographic element of claim 19 wherein the binding resin has the general formula

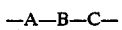

wherein a plurality of each of components A, B and C occur in ordered or random sequence in the resin and wherein A is present in said resin at about 5% to about 20% by weight and comprises groups of the formula

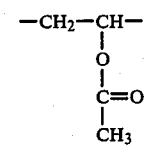

B is present in said resin at about 4% to about 30% by weight and comprises groups of the formula

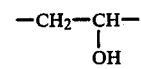

and C is present in said resin at about 50% to about 91% by weight and comprises acetal groups consisting of groups of the formulae

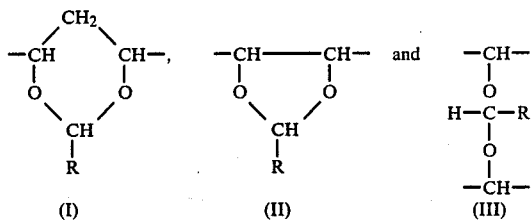

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C.

22. The photographic element of claim 14 wherein the photopolymerizable composition further comprises one or more components, selected from the group consisting of colorants, acid stabilizers, exposure indicators, plasticizers, solvents and photoactivators.

23. The photographic element of claim 14 which further comprises Michler's ketone.

24. The photographic element of claim 14 which comprises one or more compounds selected from the group consisting of a trichloromethyl triazine and a trichloromethyl quinazolinone.

25. The photographic element of claim 14 wherein the weight ratio of acridine compound to triazine or quinazolinone compound ranges from about 1:15 to about 3:1.

* * * * *